(12) United States Patent
Hsieh et al.

(10) Patent No.: US 11,887,993 B2
(45) Date of Patent: Jan. 30, 2024

(54) THIN-FILM TRANSISTORS

(71) Applicant: Hewlett-Packard Development Company, L.P., Spring, TX (US)

(72) Inventors: Hsing-Hung Hsieh, Taipei (TW); Kuan-Ting Wu, Taipei (TW); Super Liao, Taipei (TW)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 17/424,911

(22) PCT Filed: May 13, 2019

(86) PCT No.: PCT/US2019/031974
§ 371 (c)(1),
(2) Date: Jul. 22, 2021

(87) PCT Pub. No.: WO2020/231398
PCT Pub. Date: Nov. 19, 2020

(65) Prior Publication Data
US 2022/0109009 A1 Apr. 7, 2022

(51) Int. Cl.
*H01L 27/12* (2006.01)
*H01L 29/786* (2006.01)
*H10K 59/12* (2023.01)
*H01L 29/66* (2006.01)

(52) U.S. Cl.
CPC .... *H01L 27/1225* (2013.01); *H01L 29/66969* (2013.01); *H01L 29/7869* (2013.01); *H10K 59/12* (2023.02)

(58) Field of Classification Search
CPC ........... H01L 27/1225; H01L 29/66969; H01L 29/7869; H01L 29/42384; H10K 59/12
USPC .......................................................... 257/43
See application file for complete search history.

(56) References Cited

U.S. PATENT DOCUMENTS

| 8,384,076 B2 | 2/2013 | Park et al. |
| 8,822,988 B2 | 9/2014 | Korthuis et al. |
| 9,859,437 B2 | 1/2018 | Morosawa et al. |
| 10,529,924 B2* | 1/2020 | Yu .................. H10K 77/111 |
| 11,158,700 B2* | 10/2021 | Beak ................ H10K 59/1213 |
| 2005/0074930 A1 | 4/2005 | Chen et al. |

(Continued)

FOREIGN PATENT DOCUMENTS

WO WO-2018125082 A1 7/2018

*Primary Examiner* — Kimberly N Rizkallah
*Assistant Examiner* — Pratiksha Jayant Lohakare
(74) *Attorney, Agent, or Firm* — Dierker & Kavanaugh, P.C.

(57) ABSTRACT

The present disclosure is drawn to thin-film transistors, electronic displays that include thin-film transistors, and methods of making thin-film transistors. In one example, a thin-film transistor can include a nonconductive substrate, a semiconductor layer on the nonconductive substrate, a source electrode adjacent a first side of the semiconductor layer and partially overlapping a first peripheral portion of the semiconductor layer, a drain electrode adjacent a second side of the semiconductor layer and partially overlapping a second peripheral portion of the semiconductor layer, an etch stop layer on the semiconductor layer, a gat insulator layer on the etch stop layer, and a gate electrode on the gate insulator layer. The source electrode and the drain electrode do not overlap the etch stop layer.

16 Claims, 5 Drawing Sheets

(56) References Cited

U.S. PATENT DOCUMENTS

| | | |
|---|---|---|
| 2007/0052019 A1 | 3/2007 | Rudin |
| 2007/0252147 A1* | 11/2007 | Kim .................. H01L 29/7869 |
| | | 257/59 |
| 2011/0095288 A1 | 4/2011 | Morosawa et al. |
| 2012/0305921 A1 | 12/2012 | Park et al. |
| 2014/0084282 A1 | 3/2014 | Cao et al. |
| 2015/0194534 A1* | 7/2015 | Lee .................. H01L 29/78618 |
| | | 257/43 |
| 2016/0359054 A1 | 12/2016 | Fang et al. |
| 2017/0255044 A1 | 9/2017 | Ge |
| 2018/0175127 A1* | 6/2018 | Lee .................. H10K 59/1213 |
| 2018/0286861 A1 | 10/2018 | Choi et al. |
| 2020/0144309 A1* | 5/2020 | Jeon .................. H01L 27/1218 |
| 2020/0303555 A1* | 9/2020 | Yang .................. H01L 21/0251 |
| 2020/0395426 A1* | 12/2020 | Han .................. H10K 59/1213 |

\* cited by examiner

THIN-FILM TRANSISTORS

BACKGROUND

Certain types of electronic displays include an array of thin-film transistors. The thin-film transistors allow individual pixels in the display to be addressed. The individual transistors can act as a switch to turn pixels on and off or to adjust the brightness of the individual pixels. In some cases, the thin-film transistors are associated with a liquid crystal material that can transition from transparent to opaque in order to block light from a backlight unit of the display. Color filters, such as red, green, and blue color filters, can also be positioned on the backlight so that the liquid crystal can independently adjust the brightness of the different colors of light. In this way, a full-color image can be displayed. The thin-film transistors are generally formed by depositing films of certain materials on a substrate and selectively removing parts of the films by etching or other processes to form transistors. The types of materials involved can include conductive materials, semiconductive materials, and insulating materials.

Figure 1:
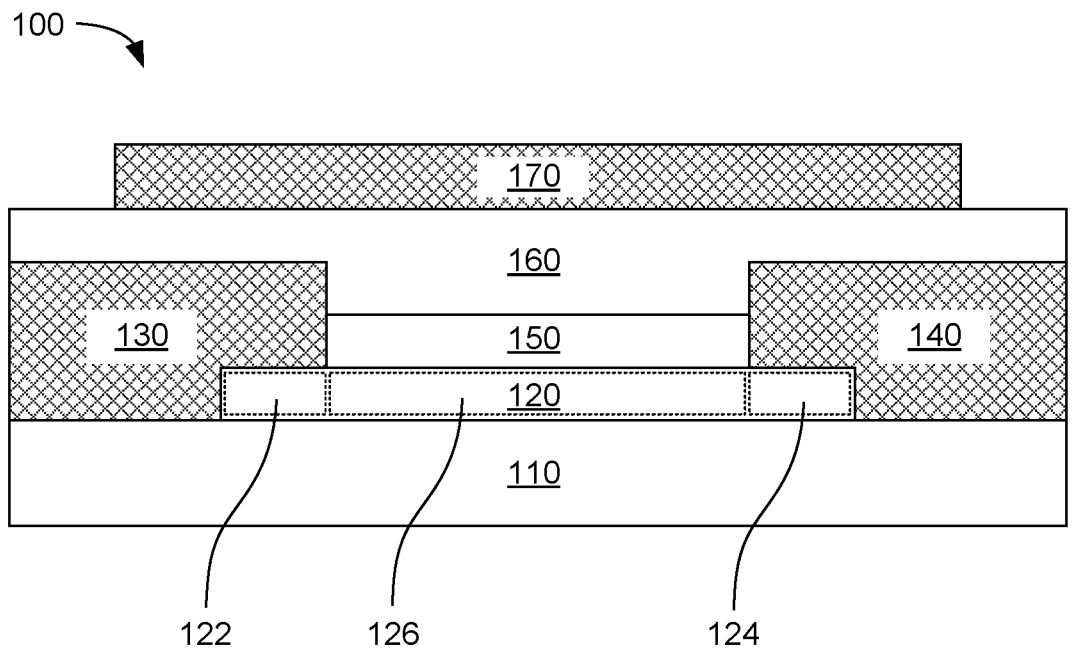
FIG. 1 is a cross-sectional view of an example thin-film transistor in accordance with the present disclosure.

The figures depict examples of the presently disclosed technology. However, it is understood that the present technology is not limited to the examples depicted.

DETAILED DESCRIPTION

The present disclosure describes thin-film transistors, electronic displays that include thin-film transistors, and methods of making thin-film transistors. In one example, a thin-film transistor can include: a nonconductive substrate; a semiconductor layer on the nonconductive substrate; a source electrode adjacent a first side of the semiconductor layer and partially overlapping a first peripheral portion of the semiconductor layer; a drain electrode adjacent a second side of the semiconductor layer and partially overlapping a second peripheral portion of the semiconductor layer; an etch stop layer on the semiconductor layer, wherein the source electrode and drain electrode do not overlap the etch stop layer; a gate insulator layer on the etch stop layer; and a gate electrode on the gate insulation layer. In some examples, the semiconductor layer, source electrode, drain electrode, gate electrode, or a combination thereof can include transparent materials. In further examples, the nonconductive substrate can be a flexible material. In still further examples, the semiconductor layer can include indium gallium zinc oxide, indium tin zinc oxide, indium zinc oxide, indium tin oxide, indium gallium oxide, indium oxide, zinc oxide, tin oxide, gallium oxide, or a combination thereof. In certain examples, the source electrode, drain electrode, and gate electrode can include aluminum, copper, molybdenum, titanium, silver, gold, indium tin oxide, indium zinc oxide, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), or a combination thereof. In some examples, the etch stop layer can cover an entire width of the semiconductor layer not overlapped by the source electrode and the drain electrode. In further examples, an entire area of the semiconductor layer underlying the etch stop layer can be influenced by a field from the gate electrode. In other examples, the semiconductor layer can be in direct contact with the nonconductive substrate and the source electrode and drain electrode can also be in direct contact with the nonconductive substrate.

In another example of the present disclosure, an electronic display can include an array of thin-film transistors on a nonconductive substrate. The individual thin-film transistors can include: a semiconductor layer on the nonconductive substrate; a source electrode adjacent a first side of the semiconductor layer and partially overlapping a first peripheral portion of the semiconductor layer; a drain electrode adjacent a second side of the semiconductor layer and partially overlapping a second peripheral portion of the semiconductor layer; an etch stop layer on the semiconductor layer, wherein the source electrode and drain electrode do not overlap the etch stop layer; a gate insulator layer on the etch stop layer; and a gate electrode on the gate insulation layer. In some examples, the electronic display can also include a liquid crystal, an organic light emitting diode, or combination thereof. In certain examples, the semiconductor layer can include indium gallium zinc oxide, indium tin zinc oxide, indium zinc oxide, indium tin oxide, indium gallium oxide, indium oxide, zinc oxide, tin oxide, gallium oxide, or a combination thereof, and the source electrode, drain electrode, and gate electrode can include aluminum, copper, molybdenum, titanium, silver, gold, indium tin oxide, indium zinc oxide, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), or a combination thereof. In other examples, an entire area of the semiconductor layer underlying the etch stop layer can be influenced by a field from the gate electrode.

Another example of the present disclosure includes a method of making a thin-film transistor. The method can include forming a layered structure that includes a nonconductive substrate, a semiconductor layer on the nonconductive substrate, an etch stop layer covering a central area of the semiconductor layer peripheral portions of the semiconductor not covered by the etch stop layer, and a photoresist layer on the etch stop layer, and can further include depositing a conductive layer on the photoresist layer, on the nonconductive substrate, and on the semiconductor layer at the portions that are not covered by the etch stop layer. In further detail, the method can include etching away the photoresist material to remove the conductive material overlying the photoresist material to form a source electrode and a drain electrode from the conductive layer, wherein the source electrode overlaps a first peripheral portion of the semiconductor layer not covered by the etch stop layer, wherein the drain electrode overlaps a second peripheral portion of the semiconductor layer not covered by the etch stop layer, and wherein the source electrode and the drain electrode do not overlap the etch stop layer. The method can also include depositing a gate electrode on the etch stop layer that is electrically insulated relative to the source electrode, the drain electrode, and the semiconductor layer.

In certain examples, the semiconductor layer, the etch stop layer, the conductive material, or a combination thereof can be formed or deposited by sputtering, solution processing, inkjet printing, spin coating, spray coating, or a combination thereof. In still further examples, the semiconductor layer can include indium gallium zinc oxide, indium tin zinc oxide, indium zinc oxide, indium tin oxide, indium gallium oxide, indium oxide, zinc oxide, tin oxide, gallium oxide, or a combination thereof.

Thin-Film Transistors

FIG. 1 shows a cross-sectional view of an example thin-film transistor 100 in accordance with examples of the present disclosure. The thin-film transistor includes a nonconductive substrate 110 with a semiconductor layer 120 on the nonconductive substrate. A source electrode 130 is adjacent one side of the semiconductor layer, and the source electrode partially overlaps the peripheral portion of the semiconductor layer. For clarity, the term "peripheral portion" can refer to an outer region of the semiconductor layer (at a major surface such as where a central portion of the etch stop layer is applied, as described below) and/or the edge of the semiconductor layer that may define a plane that transects this major surface, for example). A drain electrode 140 is adjacent to the other side of the semiconductor layer, partially overlapping the other peripheral portion of the semiconductor layer. As used herein, "partially overlapping" refers to the electrodes overlapping a portion of the surface of the semiconductor layer, but leaving a portion of the surface uncovered. The very peripheral portion, or corner, of the semiconductor layer may be entirely covered by one of the electrodes, but the electrode is said to partially overlap because a portion of the top surface of the semiconductor layer is left uncovered. In this example, the portion of the top surface of the semiconductor layer that is not covered by the source and drain electrodes is covered by an etch stop layer 150. As shown in the figure, the source electrode and drain electrode do not overlap any portion of the etch stop layer. A gate insulator layer 160 is on the etch stop layer and a gate electrode 170 is on the gate insulator layer. The gate insulator separates the gate electrode from the source electrode, drain electrode, and the semiconductor layer. The figure also shows three regions of the semiconductor layer outlines with dashed boxes. A source contact region 122 is the part of the semiconductor layer that is in contact with the source electrode. The source electrode overlaps the peripheral portion of the semiconductor layer and the overlapping area can provide a sufficient electrical contact between the source electrode and the semiconductor layer. The semiconductor layer also includes a drain contact region 124 that is the portion of the semiconductor layer in contact with the drain electrode. Between the source contact region and the drain contact region there is a gate-influenced region 126. This is the portion of the semiconductor layer that can be influenced by an electric field from the gate electrode. When a voltage is applied to the gate electrode, the electric field from the gate electrode can change the resistivity of the semiconductor layer within the gate-influenced region. The electric field is blocked by the source electrode and drain electrode, so that the portions of the semiconductor layer beneath the source and drain electrodes are not influenced by the electric field. Generally, the thin-film transistor can work by applying a particular voltage to the gate electrode to control the resistivity of the semiconductor layer, and thereby controlling the current flowing from the source electrode to the drain electrode. In some cases the semiconductor layer can also be referred to as the "channel" of the thin-film transistor. Accordingly, these terms can be used interchangeably.

The thin film transistors described herein can in some examples have increased performance and durability compared to other types of thin-film transistors. The thin-film transistors described herein can be top gate type. This means that when the nonconductive substrate is defined as the bottom, the gate electrode is at the top of the transistor relative to the position of the semiconductor layer. The top gate design can provide increased durability of the transistor compared to bottom gate designs, in which the gate electrode is closer to the bottom and the semiconductor layer is closer to the top. In some examples, the semiconductor material of the semiconductor layer can be sensitive to the atmosphere, and can degrade over time in the presence of air. The top gate design places the gate and gate insulator on the semiconductor layer, with the substrate layer beneath the semiconductor layer, so that the semiconductor layer is more protected on both sides from the atmosphere. Thus, the degradation of the semiconductor layer due to the atmosphere can be reduced. The thin-film transistors described herein can also include an etch stop layer on the semiconductor layer. The etch stop layer can protect the semiconductor layer from damage during etching processes used to form the layers above the semiconductor layer.

The thin-film transistors described herein can have a source electrode and a drain electrode that do not overlap the etch stop layer. In certain other designs, the source electrode and drain electrode can partially overlap the etch stop layer. Because the source and drain electrodes block the electric field from the gate electrode, this overlap reduces the size of the gate-influenced region of the semiconductor layer. The parts of the source and drain electrodes that overlap the etch stop layer block the electric field, so that the portions of the semiconductor layer below the overlap cannot be influenced by the electric field. Unlike the portions of the source and drain electrode overlapping the peripheral portions of the semiconductor layer, which provide electrical contact to the semiconductor layer, the portions of the electrode overlapping the etch stop layer are not in electrical contact with the semiconductor layer. Therefore, these portions do not provide any utility for the transistor and merely increase the amount of the semiconductor layer that cannot be influenced by the gate electrode. The portions of the semiconductor layer that are not influenced by the gate electrode effectively add a constant resistance between the source and drain electrodes and diminish the performance of the transistor.

In some cases, the reason for including an overlap of the source and drain electrodes on the etch stop layer has to do with designing around manufacturing tolerances. In some examples, the layers of materials forming the thin-film transistor can be formed by processes that include depositing a continuous layer of material, then depositing a photoresist, patterning the photoresist, and etching to remove portions of the layer of material. Because of the small size of the thin-film transistors and the tolerances involved in these manufacturing processes, in some cases the source electrode and drain electrode can be designed to have a partial overlap on the top of the etch stop layer. The source and drain electrodes may be formed by depositing a continuous layer of metal or other conductive material, then using a photoresist and etching to remove a portion of the material on the etch stop layer in order to separate the source electrode from the drain electrode. The partial overlap on the etch stop layer can be by design, to protect against the possibility of the photoresist pattern being slightly off. If the source and drain electrodes are design to line up exactly with the peripheral portions of the etch stop layer, but the photoresist pattern is slightly off center, then the etching process might etch down past the peripheral portion of the etch stop layer and damage the semiconductor layer below. However, as mentioned above, the overlap on the etch stop layer can reduce the performance of the thin-film transistor. Furthermore, the amount of overlap may not be constant due to tolerance issues, which can make the performance of the thin-film transistors non-uniform within an array of transistors in a single device, and the performance may vary from device to device.

As mentioned above, the thin-film transistors described herein have a source electrode and a drain electrode that do not overlap the etch stop layer. Instead, the peripheral portion of the source electrode and the peripheral portion of the drain electrode can line up precisely with the peripheral portions of the etch stop layer. The source and drain electrodes can be formed using a new process that does not risk damaging the semiconductor layer below. Generally, the process of making the thin-film transistors can include forming the etch stop layer by depositing a layer of etch stop material on the semiconductor layer, then deposition a layer of photoresist material on the layer of etch stop material. The photoresist material can be developed and then the layer of etch stop material can be etched to leave an etch stop layer covering a central area of the semiconductor layer. At this point in the process, the photoresist material is not removed from the top of the etch stop layer. A metal or other conductive material is deposited on the top of the photoresist layer and the exposed peripheral portions of the semiconductor layer. Then, the photoresist layer on top of the etch stop layer can be removed, which can remove the portion of the conductive material directly overlying the photoresist layer. This can form a source electrode and a drain electrode that do not overlap the etch stop layer because the photoresist layer was exactly the same size as the etch stop layer. This process can produce thin-film transistors that have better performance and are more uniform, repeatable, stable, and reliable than other types of thin-film transistors. Processes for making the thin-film transistors described herein are explained in more detail below.

The nonconductive substrate used in the thin-film transistors described herein can be any suitable nonconductive material. In some examples, the nonconductive substrate can include silicon dioxide, alumina, glass, or combinations thereof. In further examples, the nonconductive substrate can include a wafer such as silicon wafer or gallium nitride wafer coated with a nonconductive coating. In further examples, the nonconductive substrate can include a metal such as steel coated with a nonconductive coating. The nonconductive substrate can also be a flexible material in some examples. Non-limiting examples of flexible nonconductive substrates can include polyethylene naphthalate, polyethylene terephthalate, polyimide, polydimethylsiloxane, polyarylate, polyether sulfone, polyurethane, polycarbonate, and combinations thereof.

In further examples, the semiconductor layer can be made from a semiconducting material such as silicon or other group IV semiconductors, group VI semiconductors, semiconductors including compounds of elements from groups I-VI, oxide semiconductors, organic semiconductors, and others. In certain examples, the semiconductor layer can be an oxide semiconductor. Non-limiting examples of oxide semiconductors that can be used include indium gallium zinc oxide, indium tin zinc oxide, indium zinc oxide, indium tin oxide, indium gallium oxide, indium oxide, zinc oxide, tin oxide, gallium oxide, and combinations thereof. Any of these materials can include dopants if desired to modify properties of the semiconductor. Accordingly, as used herein, a particular material can include the pure material and the material including dopants. For example, the material "indium gallium zinc oxide" can include a pure material that consists of indium, gallium, zinc, and oxygen without any additional dopants, as well as doped materials that include indium, gallium, zinc, and oxygen in addition to dopant elements. The relative stoichiometry of the various elements in the oxide semiconductors can vary. In a particular example, the semiconductor layer can include indium gallium zinc oxide with the atomic ratios In:Ga:Zn:O=1:1:1:4. In another particular example, the semiconductor layer can include indium gallium zinc oxide with the atomic ratios In:Ga:Zn:O=2:2:1:7.

In some examples, the dimensions of the semiconductor layer can vary depending on the size of the array to be used in a device. In some examples, the semiconductor layer can have a thickness from about 10 nm to about 100 nm.

The source electrode and drain electrode can be formed of any suitable conductive material. In some cases the source electrode and drain electrode can be formed of a transparent material. When used in electronic displays, transparent materials can transmit light from the display instead of blocking light. In other examples, the source electrode and drain electrode can be made of a non-transparent material such as metal. In many cases, the thin-film transistor can be relatively small compared to the size of a pixel in an electronic display. Thus, a display can include thin-film transistors that are located at peripheral portions of pixels or between pixels, and the thin-film transistors will not degrade the appearance of the display. Non-limiting examples of materials that can be used to form the source and drain electrodes can include aluminum, copper, molybdenum, titanium, silver, gold, indium tin oxide, indium zinc oxide, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), and combinations thereof.

The source electrode and drain electrode can be deposited adjacent to sides of the semiconductor layer. In some examples, the source and drain electrodes can be adjacent to opposite sides of the semiconductor layer. The source and drain electrodes can contact the semiconductor layer along a side face of the semiconductor layer. The source and drain electrodes can also partially overlap the semiconductor layer as shown in FIG. 1. Thus, the source and drain electrodes can be in contact with the top surface of the semiconductor layer in the overlapping area. In some examples, the source and drain electrodes can overlap the semiconductor layer to a distance of 0.5 µm to 5 µm from the peripheral portion of the semiconductor layer. In further examples, the portions of the source and drain electrodes that are not overlapping the semiconductor layer can be deposited directly onto the substrate. In certain examples, the semiconductor layer and the source and drain electrodes can all be in direct contact with the nonconductive substrate. In further examples, the source electrode and drain electrode can be deposited with a thickness from about 30 nm to about 900 nm.

As mentioned above, an etch stop layer can be placed on the semiconductor layer to protect the semiconductor layer from subsequent etching processes. The etch stop layer can include a protective material such as silicon dioxide, silicon carbide, silicon nitride, non-conductive polymer materials such as polyimide, or others. The etch stop layer can have a thickness of 50 nm to 500 nm in some examples. In further examples, the etch stop layer can cover the entire surface of the semiconductor layer that is not overlapped by the source or drain electrodes. Thus, the entire top surface of the semiconductor layer can be covered either by the etch stop layer, the source electrode, or the drain electrode.

A gate insulator can be deposited on the etch stop layer and the source and drain electrodes. In some examples, the gate insulator can include an insulating material such as silicon dioxide, glass, polyethylene naphthalate, polyethylene terephthalate, polyimide, polydimethylsiloxane, polyarylate, polyether sulfone, polyurethane, polycarbonate, or combinations thereof. In further examples, the gate insulator can fill in the gap between the source electrode and the drain electrode, and the gate insulator can be direct contact with the etch stop layer.

The gate electrode can be formed on the gate insulator layer. The gate insulator layer can separate the gate electrode from the source electrode and the drain electrode. As mentioned above, a voltage can be applied to the gate electrode to create an electric field that can affect the resistivity of the semiconductor layer below. Because the source electrode and drain electrode do not overlap the etch stop layer, the entire area of the semiconductor layer underlying the etch stop layer can be influence by the field from the gate electrode. In some examples, the gate electrode can be made from any of the conductive materials listed above for the source electrode and the drain electrode. In further examples, the gate electrode can be deposited with a thickness from about 30 nm to about 900 nm.

The materials forming the semiconductor layer, etch stop layer, electrode layers, gate insulator layer, and so on can be deposited using any suitable deposition process. In some examples, the materials can be deposited by physical vapor deposition (PVD), chemical vapor deposition (CVD), atomic layer deposition (ALD), spin coating, spray coating, solution processing, fluid-jet printing, roll-to-roll printing, and so on. In certain examples, the structures can be formed by depositing a layer of material and then removing a portion of the deposited material. Removing material can be carried out by applying a photoresist material, patterning the photoresist material, and removing a portion of the material based on the pattern. In some examples, materials can be removed by etching using a process such as wet etching, dry etching, chemical-mechanical planarization (CMP), reactive-ion etching (RIE), deep reactive-ion etching (DRIE), or others.

Electronic Displays

Figure 2:
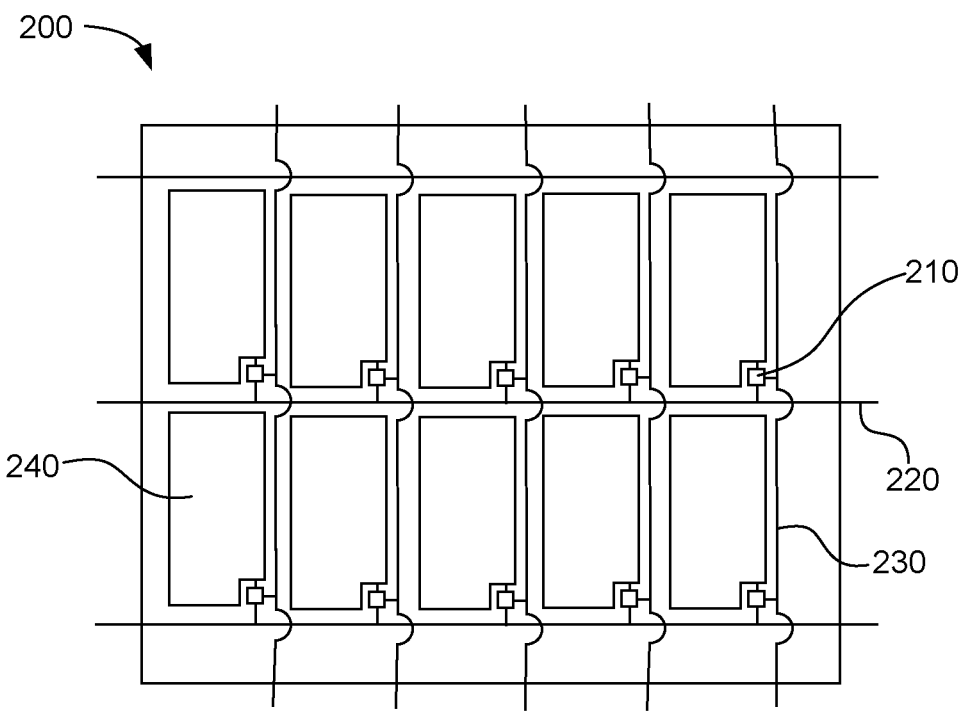
FIG. 2 is a top down view of an example electronic display in accordance with the present disclosure.

The present disclosure also extends to electronic displays that include the thin-film transistors described herein. FIG. 2 shows a schematic of a top view of an electronic display 200. The display includes an array of thin-film transistors 210. The thin-film transistors can have the structure as shown (from a side view) in FIG. 1. The thin-film transistors are connected to a signal line 220 and a scan line 230, allowing the transistors to be individually addressable. The thin-film transistors are also connected to pixel electrodes 240 such that the transistors can control the power to the pixel electrodes. The pixel electrodes can be made of a transparent conductive material such as indium tin oxide. A liquid crystal layer (not shown in the figure) can be located on the pixel electrodes, so that the pixel electrodes can control the darkness of the liquid crystal. In one such example, the gate electrode of the thin-film transistor can be connected to a scan line and the drain electrode can be connected to a signal line. The source electrode can be connected to a pixel electrode. In other examples, the source electrode can be connected to the signal line and the drain electrode can be connected to the pixel electrode. In some examples, a common electrode made of a transparent material can be placed on the liquid crystal layer, opposite from the pixel electrodes. Thus, a voltage can be applied from the pixel electrodes to the common electrode to control the opacity of the liquid crystal layer. In further examples, a color filter layer with color filters such as red, green, and blue can also be placed on the pixels so that individual pixels can display a particular color. In this example, the display can be a liquid crystal display and the display can also include a backlight unit to provide light shining through the pixel electrodes.

In other examples, the display can be any type of display having an active thin-film transistor matrix. In certain examples, the display can be an organic light emitting display (OLED), and individual light emitting diodes can be controlled using an array of the thin-film transistors described herein. In certain examples, the display can be an electronic paper display (EPD), and pixels with electrophoretic materials can be controlled using an array of the thin-film transistors described herein.

Methods of Making Thin-Film Transistors

Figure 3:
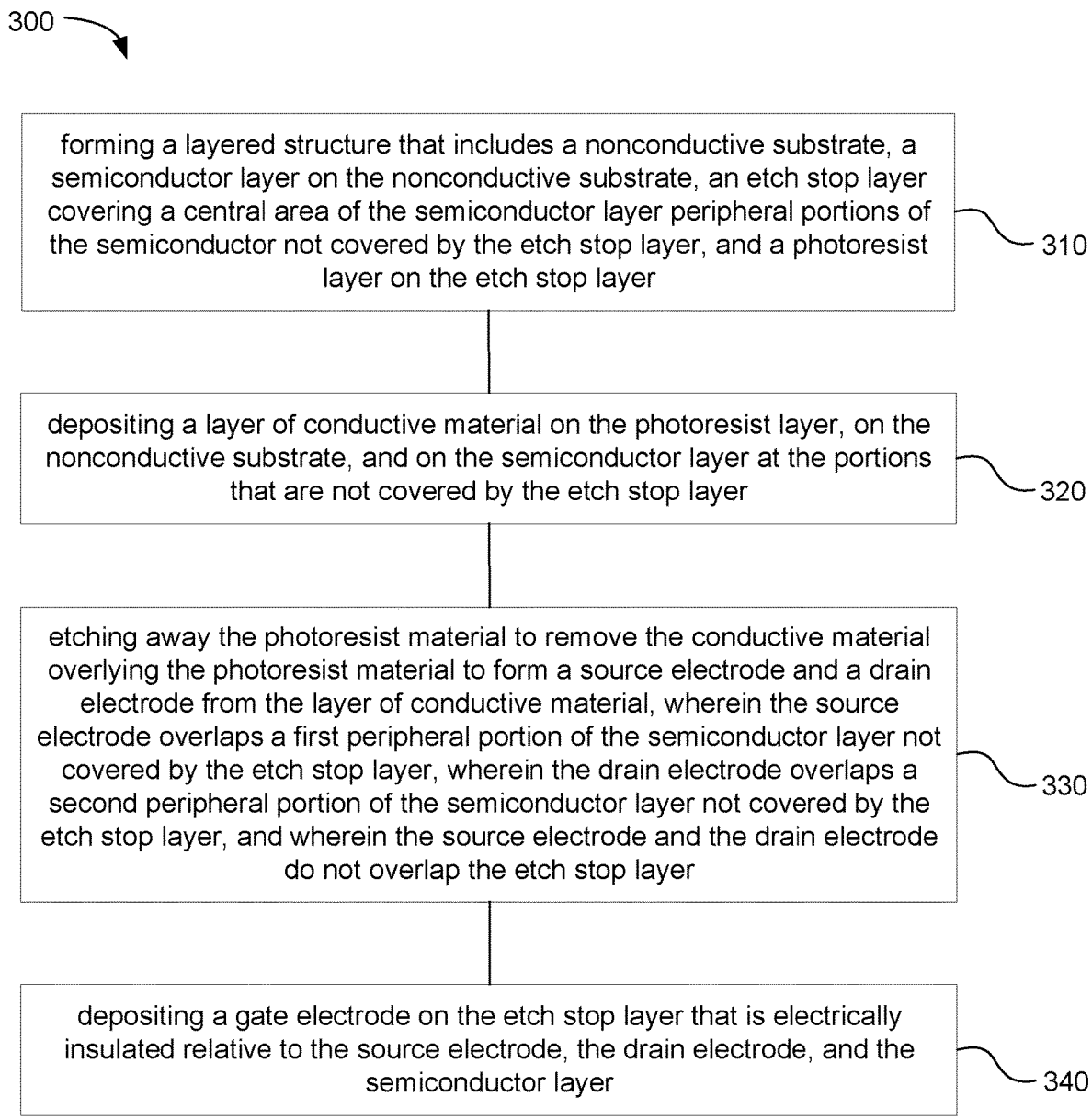
FIG. 3 is a flowchart illustrating an example method of making a thin-film transistor in accordance with the present disclosure.

The present disclosure also extends to methods of making thin-film transistors. FIG. 3 is a flowchart showing one example method 300 of making a thin-film transistor. The method can include forming 310 a layered structure that includes a nonconductive substrate, a semiconductor layer on the nonconductive substrate, an etch stop layer covering a central area of the semiconductor layer peripheral portions of the semiconductor not covered by the etch stop layer, and a photoresist layer on the etch stop layer, and can further include depositing 320 a conductive layer on the photoresist layer, on the nonconductive substrate, and on the semiconductor layer at the portions that are not covered by the etch stop layer. In further detail, the method can also include etching away 330 the photoresist material to remove the conductive material overlying the photoresist material to form a source electrode and a drain electrode from the conductive layer, wherein the source electrode overlaps a first peripheral portion of the semiconductor layer not covered by the etch stop layer, wherein the drain electrode overlaps a second peripheral portion of the semiconductor layer not covered by the etch stop layer, and wherein the source electrode and the drain electrode do not overlap the etch stop layer. The method can still further include depositing 340 a gate electrode on the etch stop layer that is electrically insulated relative to the source electrode, the drain electrode, and the semiconductor layer.

As explained above, a variety of processes can be used to form and/or deposit the materials making up the layers in the thin-film transistor. For example, materials can be deposited by sputtering, solution processing, inkjet printing, spin coating, spray coating, or a combination thereof. Any of the materials described above for each of the layers can be used in the methods of making thin-film transistors. Also as mentioned, the semiconductor layer can include indium gallium zinc oxide, indium tin zinc oxide, indium zinc oxide, indium tin oxide, indium gallium oxide, indium oxide, zinc oxide, tin oxide, gallium oxide, or a combination thereof. Other material layers and/or materials can be as described herein in other examples.

Figure 4A:
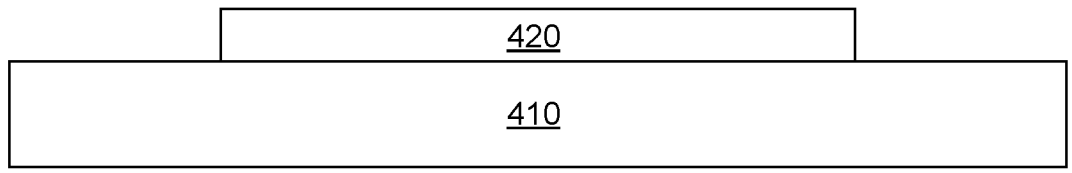
FIGS. 4A-4H are cross-sectional views of stages in an example method of making a thin-film transistor in accordance with the present disclosure.
Figure 4B:
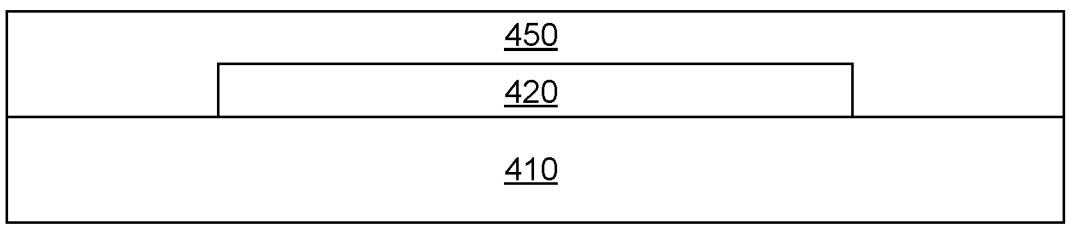
Figure 4C:
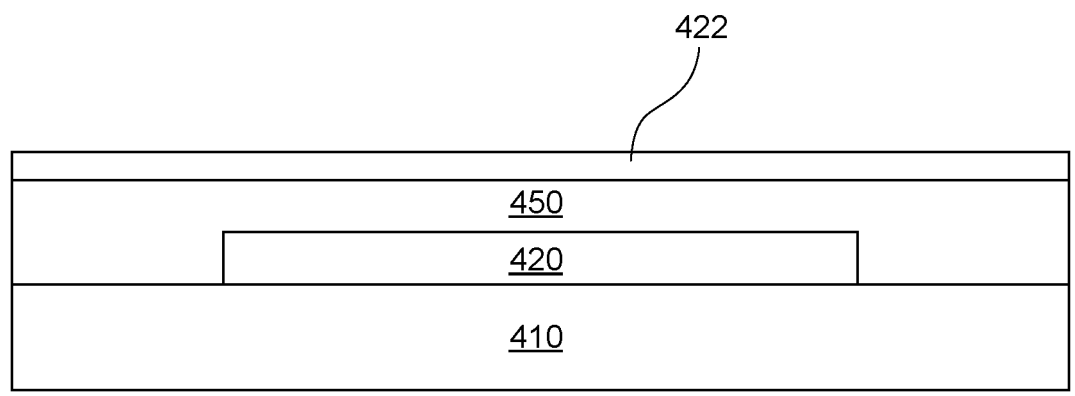
Figure 4D:
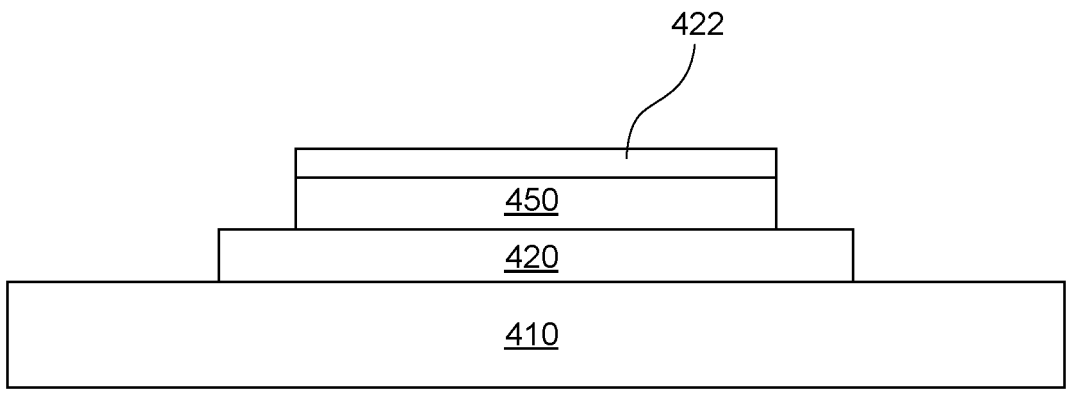
Figure 4E:
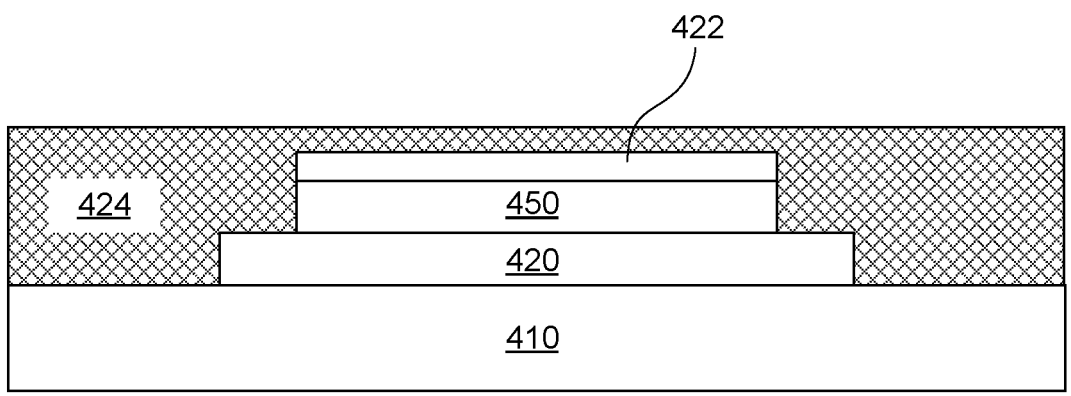
Figure 4F:
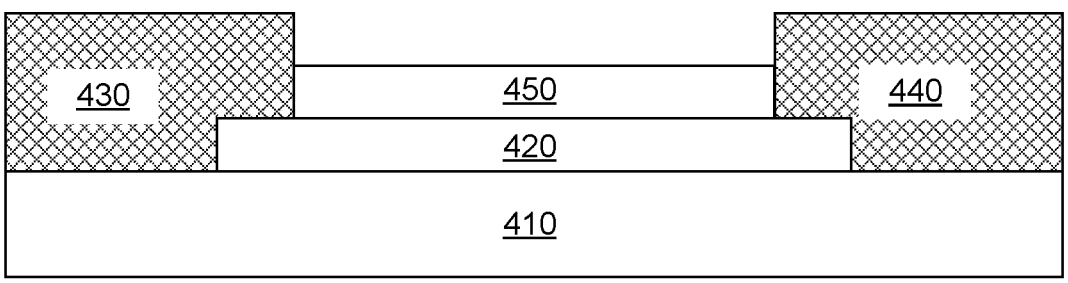
Figure 4G:
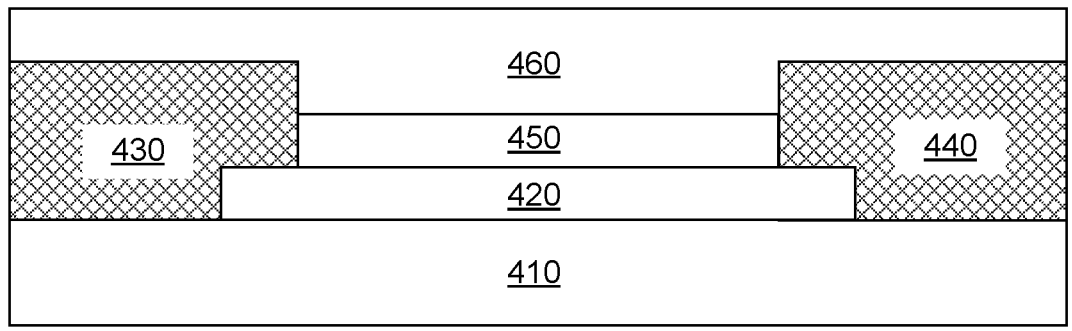
Figure 4H:
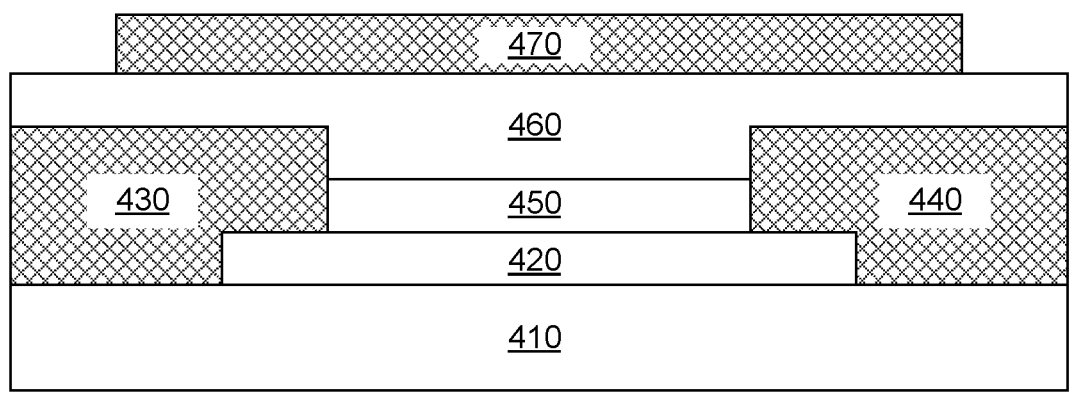

In another example, FIGS. 4A-4H show several stages in a process of making a thin-film transistor. In FIG. 4A, a semiconductor layer 420 is deposited on a nonconductive substrate 410. In FIG. 4B, a layer of etch stop material 450 is deposited on the semiconductor layer and the nonconductive substrate. A layer of photoresist material 422 is then deposited on the layer of etch stop material, as shown in FIG. 4C. In FIG. 4D, portions of the layer of etch stop material and photoresist material are etched away to form an etch stop layer covering a central area of the semiconductor layer. The photoresist material remains on the etch stop layer. As shown in FIG. 4E, a conductive layer 424 is deposited on the photoresist material on the etch stop layer, and on the semiconductor layer and the nonconductive substrate. The conductive material contacts peripheral portions of the semiconductor layer that are not covered by the etch stop layer. FIG. 4F shows the thin-film transistor after etching away the photoresist material on the etch stop layer. This removes the conductive material overlying the photoresist material to split the conductive material layer into a source electrode 430 and a drain electrode 440. The source electrode and the drain electrode overlap peripheral portions of the semiconductor layer, but do not overlap the etch stop layer. In FIG. 4G, a gate insulator layer has been deposited on the etch stop layer. Finally, in FIG. 4H, a gate electrode has been deposited on the gate insulator layer.

Definitions

It is noted that, as used in this specification and the appended claims, the singular forms "a," "an," and "the" include plural referents unless the context clearly dictates otherwise.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, the term "on" can be used to describe depositing various layers and materials that are positioned over other layers and materials. The term "on" does not infer orientation, such as an upright orientation, but rather a relative positioning to other layers that may have been previously applied or deposited. That stated, layers may be assembled without any specific order, and the terms "on" or "over" can be used merely to describe a spatial relationship to another layer, irrespective of orientation. Depositing a layer "on" or "over" a material can include depositing the layer in direct contact with the material, or with an intervening layer or multiple intervening layers, whether the respective layers are in contact or not in contact.

When referring to a layer, it can be referred to as a "layer of" material, or it can be referred to as a specific material "layer." For example, a "semiconductor layer" can be alternatively described herein "a layer of semiconductor material."

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include the numerical values explicitly recited as the limits of the range, and also to include individual numerical values or sub-ranges encompassed within that range as if each numerical value and sub-range is explicitly recited. As an illustration, a numerical range of "about 1 wt % to about 5 wt %" should be interpreted to include the explicitly recited values of about 1 wt % to about 5 wt %, and also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting a single numerical value. Furthermore, such an interpretation should apply regardless of the breadth of the range or the characteristics being described.

EXAMPLE

The following illustrates an example of the present disclosure. However, it is to be understood that the following is merely illustrative of the application of the principles of the present disclosure. Numerous modifications and alternative compositions, methods, and systems may be devised without departing from the present disclosure.

An example thin-film transistor is made using the following process:
1) A layer of glass is obtained to use as a nonconductive substrate.
2) A semiconductor layer is deposited onto the glass. The semiconductor layer is made up of indium gallium zinc oxide.
3) An etch stop is formed of silicon dioxide on a central area of the semiconductor layer, leaving the peripheral portions of the semiconductor layer exposed. A layer of photoresist material is used during the process of forming the etch stop layer, and the photoresist material on the top surface of the etch stop is allowed to remain.
4) A layer of conductive aluminum is deposited on the photoresist material, the peripheral portions of the semiconductor layer, and the substrate.
5) The photoresist material is dissolved using an etchant, removing the aluminum that was on the photoresist material. This splits the aluminum layer into a source electrode and a drain electrode.
6) A gate insulator layer made of silicon dioxide is deposited on the source electrode, drain electrode, and etch stop layer.
7) A gate electrode made of aluminum is deposited on the gate insulator layer to complete the thin-film transistor.

What is claimed is:

1. A thin-film transistor comprising:
a nonconductive substrate;
a semiconductor layer on and in direct contact with the nonconductive substrate;
a source electrode adjacent to a first side of the semiconductor layer and partially overlapping a first peripheral portion of the semiconductor layer, wherein the source electrode is in direct contact with the nonconductive substrate;
a drain electrode adjacent to a second side of the semiconductor layer and partially overlapping a second peripheral portion of the semiconductor layer, wherein the drain electrode is in direct contact with the nonconductive substrate;
an etch stop layer on the semiconductor layer, wherein the source electrode and drain electrode do not overlap the etch stop layer;
a gate insulator layer on the etch stop layer; and
a gate electrode on the gate insulator layer.

2. The thin-film transistor of claim 1, wherein the semiconductor layer, source electrode, drain electrode, gate electrode, or a combination thereof comprises transparent materials.

3. The thin-film transistor of claim 1, wherein the nonconductive substrate is a flexible material.

4. The thin-film transistor of claim 1, wherein the semiconductor layer comprises indium gallium zinc oxide, indium tin zinc oxide, indium zinc oxide, indium tin oxide, indium gallium oxide, indium oxide, zinc oxide, tin oxide, gallium oxide, or a combination thereof.

5. The thin-film transistor of claim 1, wherein each of the source electrode, drain electrode, and gate electrode comprises aluminum, copper, molybdenum, titanium, silver, gold, indium tin oxide, indium zinc oxide, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), or a combination thereof.

6. The thin-film transistor of claim 1, wherein the etch stop layer covers an entire width of the semiconductor layer not overlapped by the source electrode and the drain electrode.

7. The thin-film transistor of claim 1, wherein an entire area of the semiconductor layer underlying the etch stop layer is influenced by a field from the gate electrode.

8. The thin-film transistor of claim 1, wherein each of the source electrode, drain electrode, and gate electrode comprises gold, indium tin oxide, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), or a combination thereof.

9. An electronic display comprising an array of thin-film transistors on a nonconductive substrate, wherein individual thin-film transistors comprise:
   a semiconductor layer on and in direct contact with the nonconductive substrate;
   a source electrode adjacent a first side of the semiconductor layer and partially overlapping a first peripheral portion of the semiconductor layer, wherein the source electrode is in direct contact with the nonconductive substrate;
   a drain electrode adjacent a second side of the semiconductor layer and partially overlapping a second peripheral portion of the semiconductor layer, wherein the drain electrode is in direct contact with the nonconductive substrate;
   an etch stop layer on the semiconductor layer, wherein the source electrode and drain electrode do not overlap the etch stop layer;
   a gate insulator layer on the etch stop layer; and
   a gate electrode on the gate insulation layer.

10. The electronic display of claim 9, further comprising a liquid crystal, an organic light emitting diode, or a combination thereof.

11. The electronic display of claim 9, wherein the semiconductor layer comprises indium gallium zinc oxide, indium tin zinc oxide, indium zinc oxide, indium tin oxide, indium gallium oxide, indium oxide, zinc oxide, tin oxide, gallium oxide, or a combination thereof, and wherein the source electrode, drain electrode, and gate electrode comprise aluminum, copper, molybdenum, titanium, silver, gold, indium tin oxide, indium zinc oxide, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), or a combination thereof.

12. The electronic display of claim 9, wherein an entire area of the semiconductor layer underlying the etch stop layer is influenced by a field from the gate electrode.

13. The electronic display of claim 9, wherein each of the source electrode, drain electrode, and gate electrode comprises gold, aluminum-doped zinc oxide, indium-doped cadmium oxide, barium stannate, strontium vanadate, calcium vanadate, poly(3,4-ethylenedioxythiophene), poly(3,4-etylenedioxythiophene) doped with poly(styrene sulfonate), or a combination thereof.

14. A method of making a thin-film transistor comprising:
   forming a layered structure that includes a nonconductive substrate, a semiconductor layer on and in direct contact with the nonconductive substrate, an etch stop layer covering a central area of the semiconductor layer peripheral portions of the semiconductor not covered by the etch stop layer, and a photoresist layer on the etch stop layer;
   depositing a conductive layer on the photoresist layer, on the nonconductive substrate, and on the semiconductor layer at the portions that are not covered by the etch stop layer;
   etching away the photoresist material to remove the conductive material overlying the photoresist material to form a source electrode and a drain electrode from the conductive layer, wherein the source electrode overlaps a first peripheral portion of the semiconductor layer not covered by the etch stop layer, wherein the drain electrode overlaps a second peripheral portion of the semiconductor layer not covered by the etch stop layer, wherein the source electrode and the drain electrode do not overlap the etch stop layer, and wherein each of the source electrode and the drain electrode are in direct contact with the nonconductive substrate; and
   depositing a gate electrode on the etch stop layer that is electrically insulated relative to the source electrode, the drain electrode, and the semiconductor layer.

15. The method of claim 14, wherein the semiconductor layer, the etch stop layer, the conductive material, or a combination thereof is formed or deposited by sputtering, solution processing, inkjet printing, spin coating, spray coating, or a combination thereof.

16. The method of claim 14, wherein the semiconductor layer comprises indium gallium zinc oxide, indium tin zinc oxide, indium zinc oxide, indium tin oxide, indium gallium oxide, indium oxide, zinc oxide, tin oxide, gallium oxide, or a combination thereof.

* * * * *